United States Patent
Wu et al.

(10) Patent No.: US 8,405,439 B2
(45) Date of Patent: Mar. 26, 2013

(54) DUTY CYCLE ADJUSTING SYSTEM

(75) Inventors: Zhaolei Wu, Chengdu (CN); Guosheng Wu, Chengdu (CN)

(73) Assignee: IPGoal Microelectronics (SiChuan) Co., Ltd, Chengdu, Sichuan Province (CN)

( * ) Notice: Subject to any disclaimer, the term of this patent is extended or adjusted under 35 U.S.C. 154(b) by 7 days.

(21) Appl. No.: 13/172,873

(22) Filed: Jun. 30, 2011

(65) Prior Publication Data

US 2012/0306555 A1 Dec. 6, 2012

(30) Foreign Application Priority Data

Jun. 30, 2010 (CN) .......................... 2010 1 0213787

(51) Int. Cl.
H03K 3/017 (2006.01)
H03K 7/08 (2006.01)

(52) U.S. Cl. ........................................................ 327/175

(58) Field of Classification Search ........... 327/172–175
See application file for complete search history.

(56) References Cited

U.S. PATENT DOCUMENTS 6,680,637 B2 * 1/2004 Seo ................................. 327/175
2009/0091354 A1 * 4/2009 Aoki ............................... 327/65

* cited by examiner

*Primary Examiner* — Patrick O'Neill

(57) ABSTRACT

A duty cycle adjusting system includes a detection circuit, a first clock signal adjusting circuit connected with the detection circuit, and a second clock signal adjusting circuit connected with the detection circuit, wherein the detection circuit detects a duty cycle of a first output signal outputted by the first clock signal adjusting circuit and a duty cycle of a second output signal outputted by the second clock signal adjusting circuit, and outputs a first detection signal and a second detection signal, the first and second output signals are a pair of differential clock signals, the first and second detection signals are adapted for respectively adjusting rising edges of the pair of differential clock signals. No peripheral circuit is needed to provide the bias in the duty cycle adjusting system. The duty cycle adjusting system has the simple structure and can be independently applied to the clock path.

9 Claims, 1 Drawing Sheet

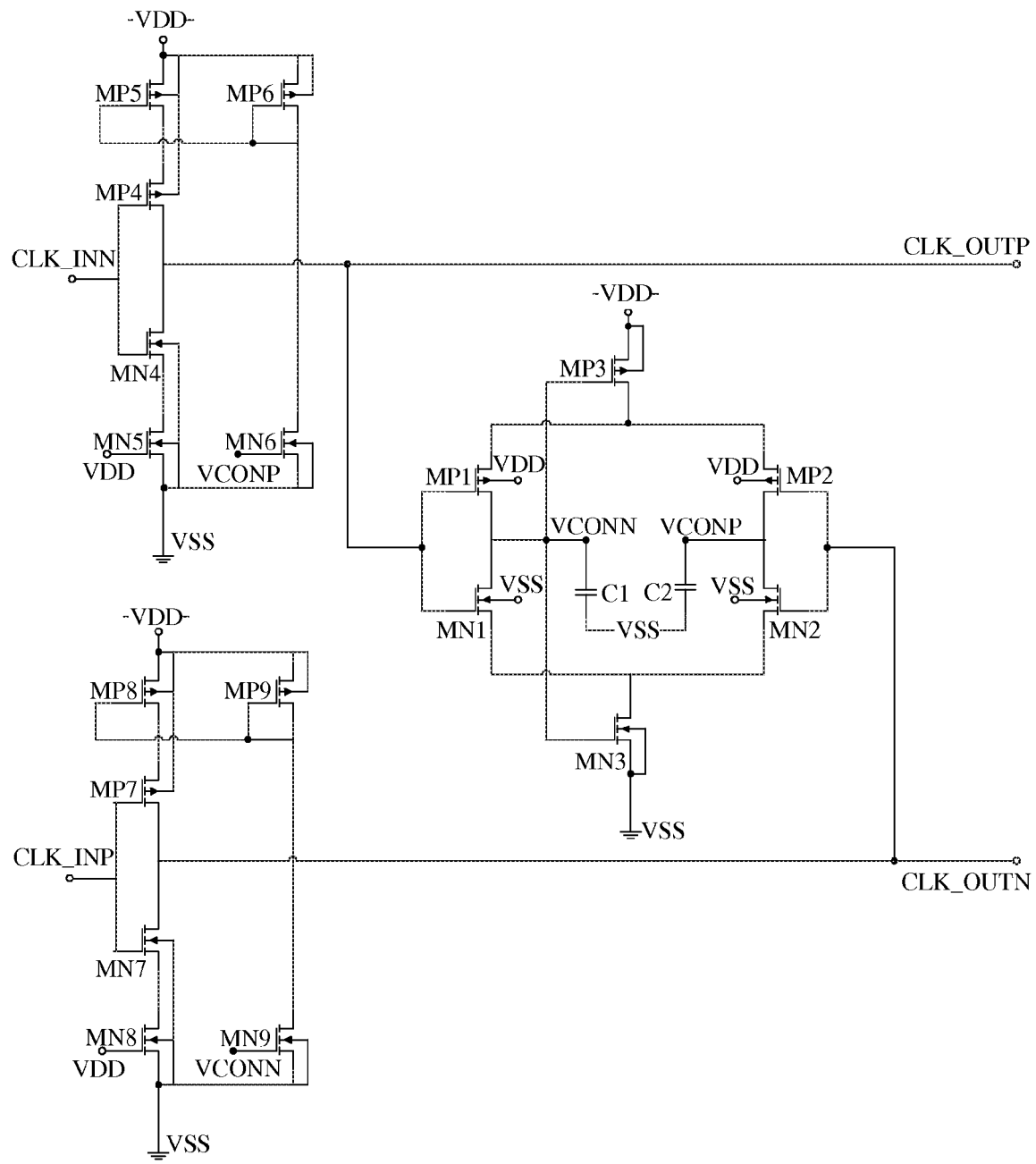

DUTY CYCLE ADJUSTING SYSTEM

BACKGROUND OF THE PRESENT INVENTION

1. Field of Invention

The present invention relates to an adjusting system, and more particularly to a duty cycle adjusting system of high-speed clock signals.

2. Description of Related Arts

Duty cycle adjusting circuits have very important significance for transmitting the high-speed clock signals. The traditional duty cycle adjusting circuits are generally achieved by adjusting the inversion threshold of the signal transmission. By increasing or decreasing the inversion threshold, the pulse widths of the high and low levels are changed, thereby the duty cycle is adjusted.

However, the traditional duty cycle adjusting circuits have the complex structure and need the bias from the peripheral circuits. Therefore, the circuit of the clock path is complex. Furthermore, it is difficult for the layout to be arranged in the integrated circuit.

SUMMARY OF THE PRESENT INVENTION

An object of the present invention is to provide a duty cycle adjusting system, wherein no peripheral circuit is needed to provide the bias.

Another object of the present invention is to provide a duty cycle adjusting system which has the simple structure and can be independently applied to the clock path.

Accordingly, in order to accomplish the above objects, the present invention provides a duty cycle adjusting system, comprising a detection circuit, a first clock signal adjusting circuit connected with the detection circuit, and a second clock signal adjusting circuit connected with the detection circuit, wherein the detection circuit detects a duty cycle of a first output signal outputted by the first clock signal adjusting circuit and a duty cycle of a second output signal outputted by the second clock signal adjusting circuit, and outputs a first detection signal and a second detection signal, the first and second output signals are a pair of differential clock signals, the first and second detection signals are adapted for respectively adjusting rising edges of the pair of differential clock signals.

Compared with the prior art, the duty cycle adjusting system of the present invention has the simple structure. No peripheral circuit is needed in the duty cycle adjusting system of the present invention to provide the bias. The duty cycle adjusting system of the present invention can be independently applied to the clock path.

These and other objectives, features, and advantages of the present invention will become apparent from the following detailed description, the accompanying drawings, and the appended claims.

BRIEF DESCRIPTION OF THE DRAWINGS

The drawing is a circuit diagram of a duty cycle adjusting system according to a preferred embodiment of the present invention.

DETAILED DESCRIPTION OF THE PREFERRED EMBODIMENT

Referring to the drawing, a duty cycle adjusting system according to a preferred embodiment of the present invention is illustrated, wherein the duty cycle adjusting system comprises a detection circuit, a first clock signal adjusting circuit connected with the detection circuit, a second clock signal adjusting circuit connected with the detection circuit.

The detection circuit comprises a first field effect transistor (FET) MP1, a second field effect transistor (FET) MN1, a third field effect transistor (FET) MP2, a fourth field effect transistor (FET) MN2, a fifth field effect transistor (FET) MP3, a sixth field effect transistor (FET) MN3, a first capacitor C1 and a second capacitor C2.

The first clock signal adjusting circuit comprises a seventh field effect transistor (FET) MP4, an eighth field effect transistor (FET) MN4, a ninth field effect transistor (FET) MP5, a tenth field effect transistor (FET) MN5, an eleventh field effect transistor (FET) MP6 and a twelfth field effect transistor (FET) MN6.

The second clock signal adjusting circuit comprises a thirteenth field effect transistor (FET) MP7, a fourteenth field effect transistor (FET) MN7, a fifteenth field effect transistor (FET) MP8, a sixteenth field effect transistor (FET) MN8, a seventeenth field effect transistor (FET) MP9 and an eighteenth field effect transistor (FET) MN9.

The specific connection relations of the duty cycle adjusting system according to the preferred embodiment of the present invention is described as follows.

A source electrode of the first FET MP1, a source electrode of the third FET MP2 and a drain electrode of the fifth FET MP3 are connected with each other. A source electrode of the fifth FET MP3 is connected with a power supply VDD. A gate electrode of the first FET MP1, a gate electrode of the second FET MN1 and a first clock signal output end CLK_OUTP of the first clock signal adjusting circuit are connected with each other. A source electrode of the second FET MN1, a source electrode of the fourth FET MN2 and a drain electrode of the sixth FET MN3 are connected with each other. A source electrode of the sixth FET MN3 is connected with a ground end VSS. A gate electrode of the third FET MP2, a gate electrode of the fourth FET MN2 and a second clock signal output end CLK_OUTN of the second clock signal adjusting circuit are connected with each other. A gate electrode of the fifth FET MP3, a drain electrode of the first FET MP1, a drain electrode of the second FET MN1, a gate electrode of the sixth FET MN3 and a first voltage port VCONN are connected with each other. A drain electrode of the third FET MP2, a drain electrode of the fourth FET MN2 and a second voltage port VCONP are connected with each other. A substrate of the first FET MP1, a substrate of the third FET MP2 and a substrate of the fifth FET MP3 are connected with the power supply VDD. A substrate of the second FET MN1, a substrate of the fourth FET MN2 and a substrate of the sixth FET MN3 are connected with the ground end VSS. The first voltage port VCONN is connected with the ground end VSS through the first capacitor C1. The second voltage port VCONP is connected with the ground end VSS through the second capacitor C2.

A gate electrode of the seventh FET MP4, a gate electrode of the eighth FET MN4 and a first clock signal input end CLK_INN are connected with each other. A source electrode of the seventh FET MP4 is connected with a drain electrode of the ninth FET MP5. A gate electrode of the ninth FET MP5, a gate electrode and a drain electrode of the eleventh FET MP6, a drain electrode of the twelfth FET MN6 are connected with each other. A source electrode of the ninth FET MP5 and a source electrode of the eleventh MP6 are connected with the power supply VDD. A substrate of the seventh FET MP4, a substrate of the ninth FET MP5 and a substrate of the eleventh MP6 are connected with the power supply VDD. A drain electrode of the seventh FET MP4, a drain electrode of the eighth FET MN4, and the first clock signal output end CLK_OUTP are connected with each other. A source electrode of the eighth FET MN4 is connected with a drain electrode of the tenth FET MN5. A gate electrode of the tenth FET MN5 is connected with the power supply VDD. A source electrode of the tenth FET MN5 and a source electrode of the twelfth FET MN6 are connected with the ground end VSS. A gate electrode of the twelfth FET MN6 is connected with the second voltage port VCONP. A substrate of the eighth FET MN4, a substrate of the tenth FET MN5 and a substrate of the twelfth FET MN6 are connected with the ground end VSS.

A gate electrode of the thirteenth FET MP7, a gate electrode of the fourteenth FET MN7 and a second clock signal input end CLK_INP are connected with each other. A source electrode of the thirteenth FET MP7 is connected with a drain electrode of the fifteenth FET MP8. A gate electrode of the fifteenth FET MP8, a gate electrode and a drain electrode of the seventeenth FET MP9, and a drain electrode of the eighteenth FET MN9 are connected with each other. A source electrode of the fifteenth FET MP8 and a source electrode of the eighteenth FET MN9 are connected with the power supply VDD. A substrate of the thirteenth FET MP7, a substrate of the fifteenth FET MP8 and a substrate of the seventeenth FET MP9 are connected with the power supply VDD. A drain electrode of the thirteenth FET MP7, a drain electrode of the fourteenth FET MN7 and the second clock signal output end CLK_OUTN are connected with each other. A source electrode of the fourteenth FET MN7 is connected with a drain electrode of the sixteenth FET MN8. A gate electrode of the sixteenth FET MN8 is connected with the power supply VDD. A source electrode of the sixteenth FET MN8 and a source electrode of the eighteenth FET MN9 are connected with the ground end VSS. A gate electrode of the eighteenth FET MN9 is connected with the first voltage port VCONN. A substrate of the fourteenth FET MN7, a substrate of the sixteenth FET MN8 and a substrate of the eighteenth FET MN9 are connected with the ground end VSS.

As shown in FIG. 1, in the duty cycle adjusting system of the preferred embodiment of the present invention, the first FET MP1, the third FET MP2, the fifth FET MP3, the seventh FET MP4, the ninth FET MP5, the eleventh FET MP6, the thirteenth FET MP7, the fifteenth FET MP8 and the seventeenth FET MP9 are P-type FETs (PMOS). The second FET MN1, the fourth FET MN2, the sixth FET MN3, the eighth FET MN4, the tenth FET MN5, the twelfth FET MN6, the fourteenth FET MN7, the sixteenth FET MN8 and the eighteenth FET MN9 are N-type FETs (NMOS). The N-type FETs (NMOS) can be replaced by the P-type FETs (PMOS). The P-type FETs (PMOS) can be replaced by the N-type FETs (NMOS). These FETs can be replaced by other switching components or circuits which are capable of achieving the same function as required.

The operating principle of the duty cycle adjusting system of the present invention is described as follows. A first input signal and a second input signal are respectively inputted into the first clock signal input end CLK_INN and the second clock signal input end CLK_INP, the first and second input signals are a pair of differential clock signals. By the first clock signal adjusting circuit, the first input signal is converted into a first output signal, the first output signal is transmitted to the detection circuit and the first clock signal output end CLK_OUTP. By the second clock signal adjusting circuit, the second input signal is converted into a second output signal, the second output signal is transmitted to the detection circuit and the second clock signal output end CLK_OUTN. The first and second output signals are a pair of differential clock signals.

The gate electrode of the first FET MP1 and the gate electrode of the second FET MN1 of the detection circuit receive the first output signal. The gate electrode of the third FET MP2 and the gate electrode of the fourth FET MN2 receive the second output signal. The detection circuit detects the duty cycle of the first output signal and the second output signal and respectively outputs the first detection signal and the second detection signal to the first voltage port VCONN and the second voltage port VCONP.

If the duty cycle of a pair of inputted differential clock signals is deviated from 50%, namely, the duty cycle of the differential clock signals is larger than or smaller than 50%, before the feedback loop enters into the stable state, namely, before completing the adjustment of the inputted differential clock signals by the duty cycle adjusting system, the duty cycle of a pair of outputted differential clock signals is also deviated from 50%. At this time, the detection circuit will detect the duty cycle of the pair of outputted differential clock signals, namely, the duty cycle of the first output signal and the second output signal, and the detection circuit respectively outputs the first detection signal and the second detection signal to the first voltage port VCONN and the second voltage port VCONP. The difference between the voltage of the first voltage port VCONN and the voltage of the second voltage port VCONP is in direct proportion to the deviation value of the duty cycle of the first output signal and the second output signal. The eighteenth FET MN9 and the twelfth FET MN6 respectively detect the voltage of the first voltage port VCONN and the voltage of the second voltage port VCONP and respectively corresponding current signals. The current of the eighteenth FET MN9 passes through the current amplifier which consists of the fifteenth FET MP8 and the seventeenth MP9 to control the rising edge of the signal of the second clock signal output end CLK_OUTN. The current of the twelfth FET MN6 passes through the current amplifier which consists of the ninth FET MP5 and the eleventh MP6 to control the rising edge of the signal of the first clock signal output end CLK_OUTP. The current of the eighteenth FET MN9 and the current of the twelfth FET MN6 directly determine the speed of the rising edge of the signal of the second clock signal output end CLK_OUTN and the speed of the rising edge of the signal of the first clock signal output end CLK_OUTP, respectively. Therefore, the duty cycle of the first output signal and the second output signal can be adjusted by adjusting the rising edge of the signal of the second clock signal output end CLK_OUTN and the rising edge of the signal of the first clock signal output end CLK_OUTP. When the voltage of the first voltage port VCONN is equal to the voltage of the second voltage port VCONP, the duty cycle of the first output signal and the second output signal is 50%, thereby the duty cycle is adjusted.

The duty cycle adjusting system of the present invention has the simple structure. No peripheral circuit is needed to provide the bias in the duty cycle adjusting system of the present invention. The duty cycle adjusting system of the present invention can be independently applied to the clock path.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A duty cycle adjusting system, comprising a detection circuit, a first clock signal adjusting circuit connected with said detection circuit, and a second clock signal adjusting circuit connected with said detection circuit, wherein said detection circuit detects a duty cycle of a first output signal outputted by said first clock signal adjusting circuit and a duty cycle of a second output signal outputted by said second clock signal adjusting circuit, and outputs a first detection signal and a second detection signal, said first and second output signals are a pair of differential clock signals, said first and second detection signals are adapted for respectively adjusting rising edges of said pair of differential clock signals, wherein said first detection signal is adapted for adjusting rising edges of said second output signal, and said second detection signal is adapted for adjusting rising edges of said first output signal, wherein said detection circuit comprises a first field effect transistor, a second field effect transistor connected with said first field effect transistor, a third field effect transistor connected with said first field effect transistor, a fourth field effect transistor connected with said second field effect transistor, a fifth field effect transistor connected with said first and third field effect transistors, a sixth field effect transistor connected with said second and fourth field effect transistors, a first capacitor and a second capacitor connected with said first capacitor.

2. The duty cycle adjusting system, as recited in claim 1, wherein said first clock signal adjusting circuit comprises a seventh field effect transistor, an eighth field effect transistor connected with said seventh field effect transistor, a ninth field effect transistor connected with said seventh field effect transistor, a tenth field effect transistor connected with said eighth field effect transistor, an eleventh field effect transistor connected with said ninth field effect transistor, and a twelfth field effect transistor connected with said tenth field effect transistor.

3. The duty cycle adjusting system, as recited in claim 2, wherein a gate electrode of said seventh field effect transistor and a gate electrode of said eighth field effect transistor receive a first input signal, a source electrode of said seventh field effect transistor is connected with a drain electrode of said ninth field effect transistor, a gate electrode of said ninth field effect transistor, a gate electrode and a drain electrode of said eleventh field effect transistor, a drain electrode of said twelfth field effect transistor are connected with each other, a source electrode of said ninth field effect transistor and a source electrode of said eleventh are connected with a power supply.

4. The duty cycle adjusting system, as recited in claim 3, wherein a drain electrode of said seventh field effect transistor and a drain electrode of said eighth field effect transistor output said first output signal, a source electrode of said eighth field effect transistor is connected with a drain electrode of said tenth field effect transistor, a gate electrode of said tenth field effect transistor is connected with said power supply, a source electrode of said tenth field effect transistor and a source electrode of said twelfth FET are connected with a ground, a gate electrode of said twelfth field effect transistor receives said second detection signal.

5. The duty cycle adjusting system, as recited in claim 4, wherein said second clock signal adjusting circuit comprises a thirteenth field effect transistor, a fourteenth field effect transistor connected with said thirteenth field effect transistor, a fifteenth field effect transistor connected with said thirteenth field effect transistor, a sixteenth field effect transistor connected with said fourteenth field effect transistor, a seventeenth field effect transistor connected with said fifteenth field effect transistor, and an eighteenth field effect transistor connected with said sixteenth field effect transistor.

6. The duty cycle adjusting system, as recited in claim 5, wherein a gate electrode of said thirteenth field effect transistor and a gate electrode of said fourteenth field effect transistor receive a second input signal, a source electrode of said thirteenth field effect transistor is connected with a drain electrode of said fifteenth field effect transistor, a gate electrode of said fifteenth field effect transistor, a gate electrode and a drain electrode of said seventeenth field effect transistor, and a drain electrode of said eighteenth field effect transistor are connected with each other, a source electrode of said fifteenth field effect transistor and a source electrode of said seventeenth field effect transistor are connected with said power supply, wherein said second input signal and said first input signal are a pair of differential signals.

7. The duty cycle adjusting system, as recited in claim 6, wherein a drain electrode of said thirteenth field effect transistor and a drain electrode of said fourteenth field effect transistor output said second output signal, a source electrode of said fourteenth field effect transistor is connected with a drain electrode of said sixteenth field effect transistor, a gate electrode of said sixteenth field effect transistor is connected with said power supply, a source electrode of said sixteenth field effect transistor and a source electrode of said eighteenth field effect transistor are connected with said ground, a gate electrode of said eighteenth field effect transistor receives said first detection signal.

8. The duty cycle adjusting system, as recited in claim 7, wherein a gate electrode of said first field effect transistor and a gate electrode of said second field effect transistor receive said first output signal outputted by said first clock signal adjusting circuit, a gate electrode of said third field effect transistor and a gate electrode of said fourth field effect transistor receive said second output signal outputted by said second clock signal adjusting circuit, a gate electrode of said fifth field effect transistor, a drain electrode of said first field effect transistor, a drain electrode of said second field effect transistor and a gate electrode of said sixth field effect transistor are connected with a first voltage port, said first voltage port is connected with said ground through said first capacitor, a drain electrode of said third field effect transistor and a drain electrode of said fourth field effect transistor are connected with a second voltage port, said second voltage port is connected with said ground through said second capacitor, a source electrode of said first field effect transistor, a source electrode of said third field effect transistor and a drain electrode of said fifth field effect transistor are connected with each other, a source electrode of said fifth field effect transistor is connected with said power supply, a source electrode of said second field effect transistor, a source electrode of said fourth field effect transistor and a drain electrode of said sixth field effect transistor are connected with each other, a source electrode of said sixth field effect transistor is connected with said ground, wherein said first voltage port outputs said first detection signal, said second voltage port outputs said second detection signal.

9. The duty cycle adjusting system, as recited in claim 8, wherein said first field effect transistor, said third field effect transistor, said fifth field effect transistor, said seventh field effect transistor, said ninth field effect transistor, said eleventh field effect transistor, said thirteenth field effect transistor, said fifteenth field effect transistor and said seventeenth field effect transistor are field effect transistors of a first conductivity type, said second field effect transistor, said fourth field effect transistor, said sixth field effect transistor, said eighth field effect transistor, said tenth field effect transistor, said twelfth field effect transistor, said fourteenth field effect transistor, said sixteenth field effect transistor and said eighteenth field effect transistor are field effect transistors of a second conductivity type.

* * * * *